United States Patent [19]
Larimer

[11] Patent Number: 5,719,441
[45] Date of Patent: Feb. 17, 1998

[54] TRANSISTOR PACKAGE WITH INTEGRAL HEATSINK

[76] Inventor: William R. Larimer, 127 William St., Baltimore, Md. 21230

[21] Appl. No.: 682,875

[22] Filed: Jul. 11, 1996

[51] Int. Cl.$^6$ .............................. H01L 23/10; H01L 23/34
[52] U.S. Cl. ............................ 257/707; 257/706
[58] Field of Search .................... 257/707, 706, 257/705, 713, 714, 718, 719, 720, 722

[56] References Cited

U.S. PATENT DOCUMENTS

| | | | |
|---|---|---|---|
| 4,256,792 | 3/1981 | Koepke et al. | 257/705 |
| 4,765,400 | 8/1988 | Chu et al. | 257/720 |
| 4,879,632 | 11/1989 | Yamamoto et al. | 257/720 |
| 5,041,902 | 8/1991 | McShane | 257/706 |
| 5,483,102 | 1/1996 | Neal et al. | 257/706 |

*Primary Examiner*—Carl W. Whitehead
*Assistant Examiner*—S. V. Clark
*Attorney, Agent, or Firm*—Walter G. Sutcliff

[57] ABSTRACT

A metallic heatsink consisting of material having high thermal conductivity includes plural regions of finstock which underlie a ceramic window type frame enclosing at least one heat spreading insulator member on which is located at least one silicon carbide semiconductor chip including a plurality of silicon carbide transistors. On both sides of the chip are impedance transformation elements connecting bondwires to input and output leads extending through the ceramic window frame for connection of the chip to external circuitry.

21 Claims, 1 Drawing Sheet

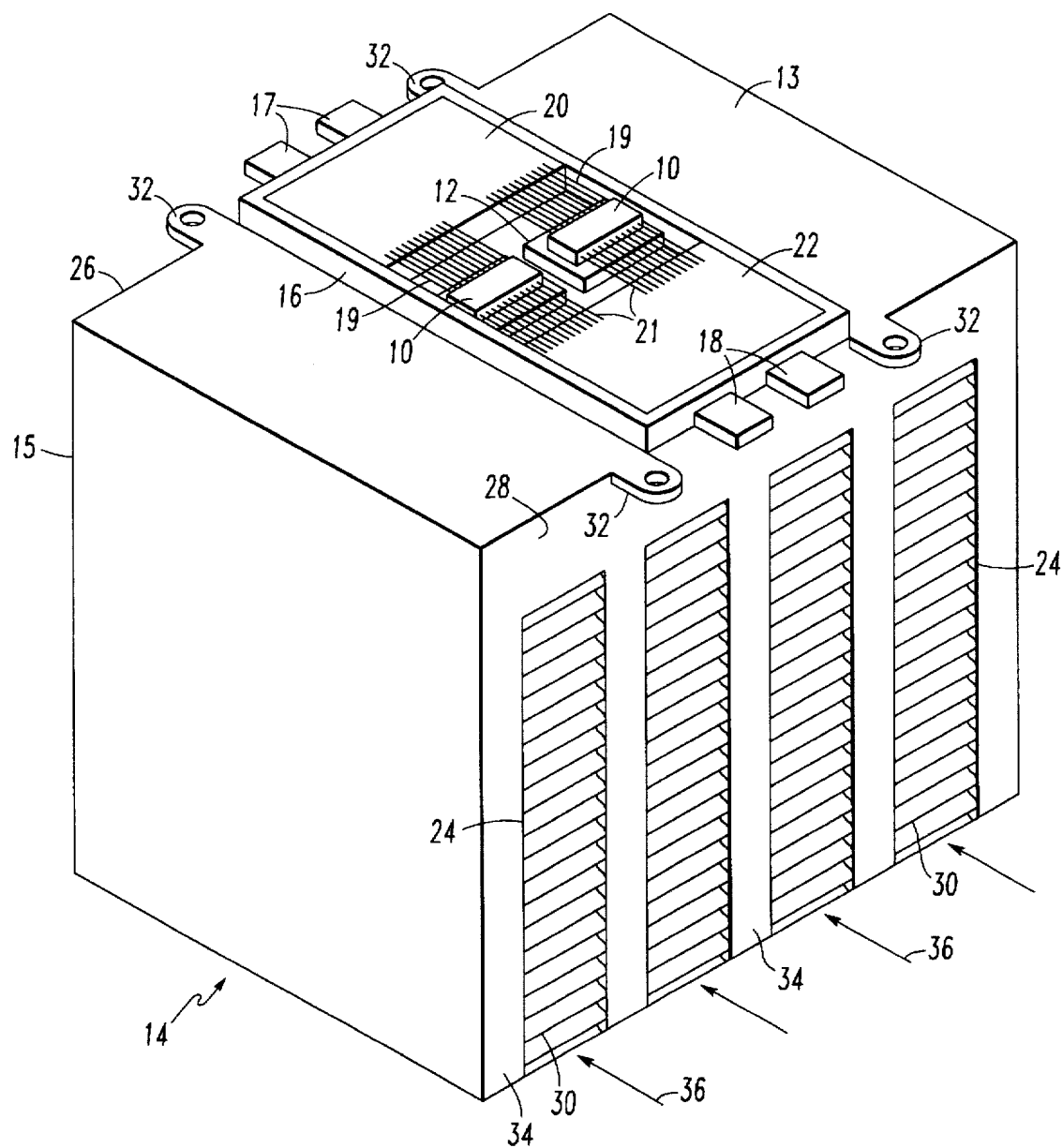

TRANSISTOR PACKAGE WITH INTEGRAL HEATSINK

BACKGROUND OF THE INVENTION

1. Field of the Invention

This invention relates generally to apparatus for cooling high power semiconductor devices and more particularly to apparatus for cooling silicon-carbide RF power transistors.

2. Description of the Prior Art

Radar and television transmitter designs currently becoming available are known to utilize a new class of power generating semiconductor devices what are known in the art as silicon-carbide transistors. These devices generate very high RF power, approximately 500 watts peak in a relatively small active area, typically 0.025 sq. in. The pulsed output signal generated by these devices can generate at least 120 watts average, provided a heat density of 20,000 watts per sq. in.

Silicon carbide transistor devices have the unique capability of reliably operating at higher junction temperatures (200° C.) than silicon transistor devices which typically operate up to 125° C. The increased package temperature for such devices promotes heat transfer from the active areas in a relatively small heat transfer area. This heat is generally conducted through the surrounding metal including the package and into the cooling medium which it is associated. It is further known that a silicon-carbide package having a temperature in the range of 130°–160° C. is sufficient to cause degradation and/or catastrophic damage to surrounding temperature sensitive components.

Typically, conventional RF devices dissipating over 20 watts are liquid cooled to maintain acceptable internal temperatures. For most transmitters systems, however, there is a distinct advantage in cooling these devices directly with air using a blower rather than a closed loop liquid cooling system. Many systems, such as commercial broadcast transmitters used for television, moreover, require air cooling.

Accordingly, transmitter amplifier using silicon carbide power devices require a thermal design for heat dissipation which efficiently directs heat to a cooling airstream while also meeting the stringent electrical acoustic and maintainability requirements associated with a commercial broadcast transmitter. Presently, there are no known semiconductor package designs available to meet such requirements.

SUMMARY

Accordingly, it is a primary object of the present invention to provide an improvement in the extraction of heat from electronic devices.

It is another object of the invention to provide an improvement in the cooling of semiconductor devices.

It is a further object of the invention to provide an improvement in the cooling of RF power transistors.

It is yet another object of the invention to provide an improvement in the cooling of silicon carbide power transistors.

Briefly, the foregoing and other objects are achieved by means of a metallic heatsink body comprised of material having high thermal conductivity and having plural regions of finstock which underlie a ceramic window type frame. At least one heat spreading insulator member on which is located a silicon carbide semiconductor structure, more particularly a die/chip including a plurality of silicon carbide transistors, is located within the ceramic frame. The insulator member is soldered, brazed or molded to the top surface of the heatsink body. On both sides of the insulator are impedance transformation regions leading to a set of input and output leads extending through the ceramic window frame for connection of the silicon carbide devices to external circuitry. Impedance transformation raises the chip's RF characteristic impedance at the input and output leads.

Further scope of applicability of the present invention will become apparent from the detailed description given hereinafter. However, it should be understood that the detailed description and specific examples, while indicating preferred embodiments of the invention, are given by way of illustration only since various changes and modifications within the spirit of scope of the invention will become apparent to those skilled in the art from this detailed description.

BRIEF DESCRIPTION OF THE DRAWING

The present invention will become more fully understood from the detailed description given hereinbelow and the accompanying drawing which is given by way of illustration only and thus is not limitative of the present invention, and wherein:

FIG. 1 is a perspective view of the preferred embodiment of the invention.

DETAILED DESCRIPTION OF THE PREFERRED EMBODIMENT

Referring now to the drawing, wherein like reference numerals refer to like components, shown thereat is a package for a pair of silicon-carbide RF power transistor chips 10 which are attached, such as being soldered, to the metallized top surface of a pair of heat spreading insulators 12 which are soldered, brazed or molded-onto the top surface 13 of a heatsink 14 shown comprising a relatively large rectangular body 15 of metallic material. The metallic material is selected on the basis of having a relatively high coefficient of thermal conductivity.

The heat insulator members 12 are shown being relatively thin, flat rectangular pads and are comprised of chemically vapor deposited diamond, beryllium oxide (BeO) or aluminum nitride (AlN) and form a pair of electrically isolated islands for the silicon carbide chips 10 soldered thereto. When the insulator members 12 are comprised of a diamond type of material, such elements exhibit a thermal conductivity of 21.4 W/°C. This is five times that of aluminum and therefore is an excellent heat spreader.

Further, the insulator pads 12 are located interiorally of a generally rectangular ceramic window frame 16 which, in addition to providing physical and environmental protection to the silicon carbide chips 10, is used to couple pairs of circuits leads 17 and 18 into the package and to provide an attachment surface for a flat lid, not shown. Between the chips 10 and the electrical leads 17 and 18 are two impedance transformation elements 20 and 22. The elements are resistive and capacitive networks intended to raise the chip's RF characteristic impedance at the input and output leads, 17 and 18. The elements are adapted to accommodate individual circuit leads, e.g. bond-wires 19, 21 coming off each of the silicon carbide high RF power transistors, typically bipolar transistors included in each of the chips 10.

The body 15 of the heatsink 14 is fabricated from a metal composite such as aluminum-silicon carbide (Al-SiC) or tungsten copper (WCu) due to the fact that both materials exhibit good thermal conductivity and relatively low thermal coefficients of expansion, typically 7 ppm/°C. These materials, moreover, match the expansion properties of BeO, for example, and are relatively close to AlN at 4.6 ppm/°C. The thermal insulators 12 are diced into as small a "footprint" as possible to minimize temperature induced stresses at their interface with the surface 13 of the heatsink body 15. Such a package, having matched coefficients of thermal expansion is thus capable of withstanding temperature extremes ranging between −54° C. to solder temperatures in the range of 300° C.

The heatsink body 15 comprises a generally rectangularly shaped mass of metal having four elongated and relatively deep cavities 24 extending between a pair of opposing side walls 26 and 28 and within which is located respective corrugated columns 30 of finstock which are soldered or brazed to the heatsink body 15 using a solder preform or braze sheet.

Also, included on the top surface 13 heatsink body 15 are four relatively thin outwardly extending mounting ears 32. The members 32 are fabricated so as to be RF conductive yet thermally resistive in order to impede heat transfer to a substrate ground plane, not shown and upon which the heatsink body 15 is mounted when used. In this matter, four small screws, not shown, can be used for installation of the heatsink 14 on a substrate ground plane, not shown.

Such a structure, as shown in FIG. 1, eliminates the contact resistance normally present when a high power semiconductor device is screwed to a separate heatsink. The heatflow path primarily includes the portions 34 of the heatsink body 15 and the finstock members 30, the latter being subjected to cooling air 36 from a source, not shown. A configuration such as shown in FIG. 1 can provide over 75 sq. in. of heat transfer within a volume of 3.6 cu. in. The thermal resistance from the die chip members 10 to the average air temperature is 0.79° C./W when using a BeO insulator 12.

The subject invention accordingly makes use of the unique high temperature operation of silicon carbide semiconductor devices and combines high conductivity insulator inserts with metal-matrix composites and corrugated finstock to create a barrier-free conduction path to an airstream directed thereto. The integral heatsink is cooled with relatively quiet air at a dissipation level six times the ordinary limit. Fewer devices are required to generate the total power level required thus reducing parts cost and is accomplished without sacrificing unit repairability or the performance of surrounding circuitry.

The invention being thus described, it would be obvious that the same may be varied in many ways. Such variations are not to be regarded as a departure from the spirit and scope of the invention, and all such modifications as would be obvious to one skilled in the art are intended to be included within the scope of the following claims.

I claim:

1. A package for cooling relatively high power heat generating semiconductor devices, comprising:

a heatsink comprised of a body of metal having relatively high thermal conductivity and at least one cavity formed therein and in which is located metallic heat dissipating means for transferring heat to an airstream directed thereto;

insulation means located on said body;

at least one heat generating semiconductor device mounted on said insulator means;

a protective frame member on said insulator means surrounding said semiconductor device and including means for supporting a set of electrical circuit leads connected to said at least one semiconductor device; and wherein said heatsink additionally includes a plurality of electrically conductive and thermally resistive mounting elements for attachment to a ground plane.

2. A package according to claim 1 wherein said frame member comprises a ceramic frame member.

3. A package according to claim 1 wherein said at least one cavity in said metallic body comprises a plurality of cavities.

4. A package according to claim 1 wherein said cavities comprise a plurality of relatively deep elongated cavities in said metallic body and said heat dissipating means comprises respective finstock members located in said cavities.

5. A package according to claim 4 wherein said cavities have a generally rectangular cross section and said finstock members comprise columns of corrugated finstock material.

6. A package according to claim 1 wherein said metallic body is fabricated from a metal composite selected from the group consisting of aluminum and silicon carbide and tungsten and copper.

7. A package according to claim 1 wherein said insulator means comprises at least one insulator member fabricated from a material selected from the group consisting of diamond, beryllium oxide and aluminum oxide.

8. A package according to claim 1 wherein said insulator means comprises at least one heat spreading insulator member.

9. A package for cooling relatively high power heat generating semiconductor devices, comprising:

a heatsink comprised of a body of metal having relatively high thermal conductivity and at least one cavity formed therein and in which is located metallic heat dissipating means for transferring heat to an airstream directed thereto;

insulator means located on said body;

at least one heat generating semiconductor device mounted on said insulator means;

a protective frame member on said insulator means surrounding said semiconductor device and including means for supporting a set of electrical input and output circuit leads connected to said at least one semiconductor device; and additionally including impedance transformation means within said frame member for providing impedance matching of said at least one semiconductor device to an external circuit.

10. A package according to claim 9 wherein said at least one semiconductor device comprises a semiconductor chip including a plurality of semiconductor devices and wherein said impedance transformation means comprises impedance transformation means located inside of said frame member on either side of said chip.

11. A package according to claim 10 wherein said insulator means comprises at least one generally flat dielectric pad for supporting said at least one semiconductor device.

12. A package according to claim 11 wherein said semiconductor device comprise transistors.

13. A package according to claim 12 wherein said transistors comprise silicon carbide transistors.

14. A package according to claim 13 wherein said silicon carbide transistors comprise silicon carbide bipolar transistors.

15. A package according to claim 10 wherein said at least one semiconductor device comprises a pair of semiconductor chips.

16. A package according to claim 15 wherein said insulator means comprises a pair of insulator members respectively having metallized top surfaces and wherein said pair of semiconductor chips are located on said metallized top surfaces.

17. A package according to claim 16 wherein said semiconductor chips include a plurality of power generating devices.

18. A package according to claim 17 wherein said power generating devices comprise transistors.

19. A package according to claim 17 wherein said transistors comprise silicon carbide transistors.

20. A package according to claim 19 wherein said silicon carbide transistors comprise bipolar transistors.

21. A package according to claim 9 wherein said impedance transformation means comprises a pair of impedance transformation regions, one on each side of said at least one semiconductor device and respectively terminating in said electrical input and output circuit leads.

* * * * *